United States Patent
Kohiro et al.

(10) Patent No.: US 7,393,412 B2
(45) Date of Patent: Jul. 1, 2008

(54) METHOD FOR MANUFACTURING COMPOUND SEMICONDUCTOR EPITAXIAL SUBSTRATE

(75) Inventors: Kenji Kohiro, Tsukuba (JP); Tomoyuki Takada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 10/579,036

(22) PCT Filed: Nov. 8, 2004

(86) PCT No.: PCT/JP2004/016905
§ 371 (c)(1),
(2), (4) Date: May 31, 2006

(87) PCT Pub. No.: WO2005/048332
PCT Pub. Date: May 26, 2005

(65) Prior Publication Data
US 2007/0087539 A1    Apr. 19, 2007

(30) Foreign Application Priority Data
Nov. 12, 2003    (JP) .............................. 2003-382116

(51) Int. Cl.
*C30B 25/12*    (2006.01)
(52) U.S. Cl. ........................ 117/104; 117/89; 117/93; 117/102; 117/105
(58) Field of Classification Search ............... 117/89, 117/93, 102, 104, 105
See application file for complete search history.

(56) References Cited

U.S. PATENT DOCUMENTS 5,994,158 A    11/1999    Kashima et al.

FOREIGN PATENT DOCUMENTS

| JP | H02-239188 A | 9/1990 |
| JP | 4-177881 A | 6/1992 |
| JP | 6-20966 A | 1/1994 |
| JP | 8-64614 A | 3/1996 |
| JP | H08-078348 A | 3/1996 |
| JP | 9-213641 A | 8/1997 |

OTHER PUBLICATIONS

D. Keiper, et al., Metal organic vapor-phase epitaxy (MOVPE) growth of InP and InGaAs usin tertiarybutylarsine (TBA) and tertiarybutylphosphine (TBP) in N2 ambient. Journal of Crystal Growth, vol. 204, 1999, pp. 256-262.*

Nakamura et al., Effect of substrate misorientation on tear-drop-like hillock defect densities in InP and GaInAsP grown by metalorganic chemical vapor deposition, Journal of Crystal Growth, 129:456-464 (1993).

* cited by examiner

*Primary Examiner*—Felisa C Hiteshew
(74) *Attorney, Agent, or Firm*—Fitch, Even, Tabin & Flannery (57) ABSTRACT

A method for manufacturing a compound semiconductor epitaxial substrate with few concave defects is provided. The method for manufacturing a compound semiconductor epitaxial substrate comprises a step of epitaxially growing an InGaAs layer on an InP single crystal substrate or on an epitaxial layer lattice-matched to the InP single crystal substrate under conditions of ratio of V/III: 10-100, growth temperature: 630° C.-700° C., and growth rate: 0.6 μm/h-2 μm/h.

6 Claims, 9 Drawing Sheets

METHOD FOR MANUFACTURING COMPOUND SEMICONDUCTOR EPITAXIAL SUBSTRATE

This Application is the National Phase of International Application No. PCT/JP2004/016905 filed Nov. 8, 2004, which designated the U.S. and was not published under PCT Article 21(2) in English, and this application claims, via the aforesaid International Application, the foreign priority benefit of and claims the priority from Japanese Application No. 2003-382116, filed Nov. 12, 2003, the complete disclosures of which are incorporated herein by reference.

TECHNICAL FIELD

The present invention relates to a method for manufacturing a compound semiconductor epitaxial substrate. More specifically, the invention relates to a method for manufacturing a compound semiconductor epitaxial substrate with few concave defects.

BACKGROUND ART

When an epitaxial layer has been grown on a single crystal substrate by conventional vapor phase epitaxy, in particular, metal-organic chemical vapor deposition (MOCVD), convex defects or concave defects have sometimes generated on or in a surface of the epitaxial layer.

Convex defects are called tear-drop-like defects or hillocks; their diameters are 10 μm to 30 μm and their heights are several tens of nanometers. Despite the convex defects, semiconductor devices can be manufactured, but in some cases, the defects have damaged photo masks used in their manufacturing process or have caused displacements of patterns. Therefore, to reduce convex defects, a method of controlling off-angle of single crystal substrate have been proposed (for example, JP-A-2-239188 and JP-A-8-78348).

On the other hand, concave defects have diameters of several micrometers and depth reaching the vicinity of an interface between a single crystal substrate and an epitaxial layer. When a semiconductor device is manufactured by using a compound semiconductor epitaxial substrate with concave defects, the semiconductor device yield decreases.

Besides, it has been difficult to reduce the concave defects through the use of the method for reducing the convex defects.

DISCLOSURE OF THE INVENTION

An object of the present invention is to provide a method for manufacturing a compound semiconductor epitaxial substrate with few concave defects.

The present inventors conducted extensive studies to reduce the concave defects, and resultantly completed the invention.

That is, the present invention provides a method for manufacturing a compound semiconductor epitaxial substrate comprising a step of epitaxially growing an InGaAs layer on an InP single crystal substrate or on an epitaxial layer lattice-matched to the InP single crystal substrate under conditions of
ratio of V/III: 10-100,
growth temperature: 630° C.-700° C. and
growth rate: 0.6 μm/h-2 μm/h.

Further, the present invention provides a method for reducing concave defects in a compound semiconductor epitaxial substrate comprising a step of epitaxially growing an InGaAs layer on an InP single crystal substrate or on an epitaxial layer lattice-matched to the InP single crystal substrate under conditions of
ratio of V/III: 10-100,
growth temperature: 630° C.-700° C. and
growth rate: 0.6 μm/h-2 μm/h.

Furthermore, the present invention provides a compound semiconductor epitaxial substrate obtained by using the above manufacturing method.

EFFECT OF THE INVENTION

According to the method for manufacturing a compound semiconductor epitaxial substrate of the present invention, a compound semiconductor epitaxial substrate with few concave defects is obtained.

Also, according to the method of the present invention, it is possible to reduce concave defects in a compound semiconductor epitaxial substrate.

BEST MODE FOR CARRYING OUT THE INVENTION

Method for Manufacturing Compound Semiconductor Epitaxial Substrate

Figure 1:
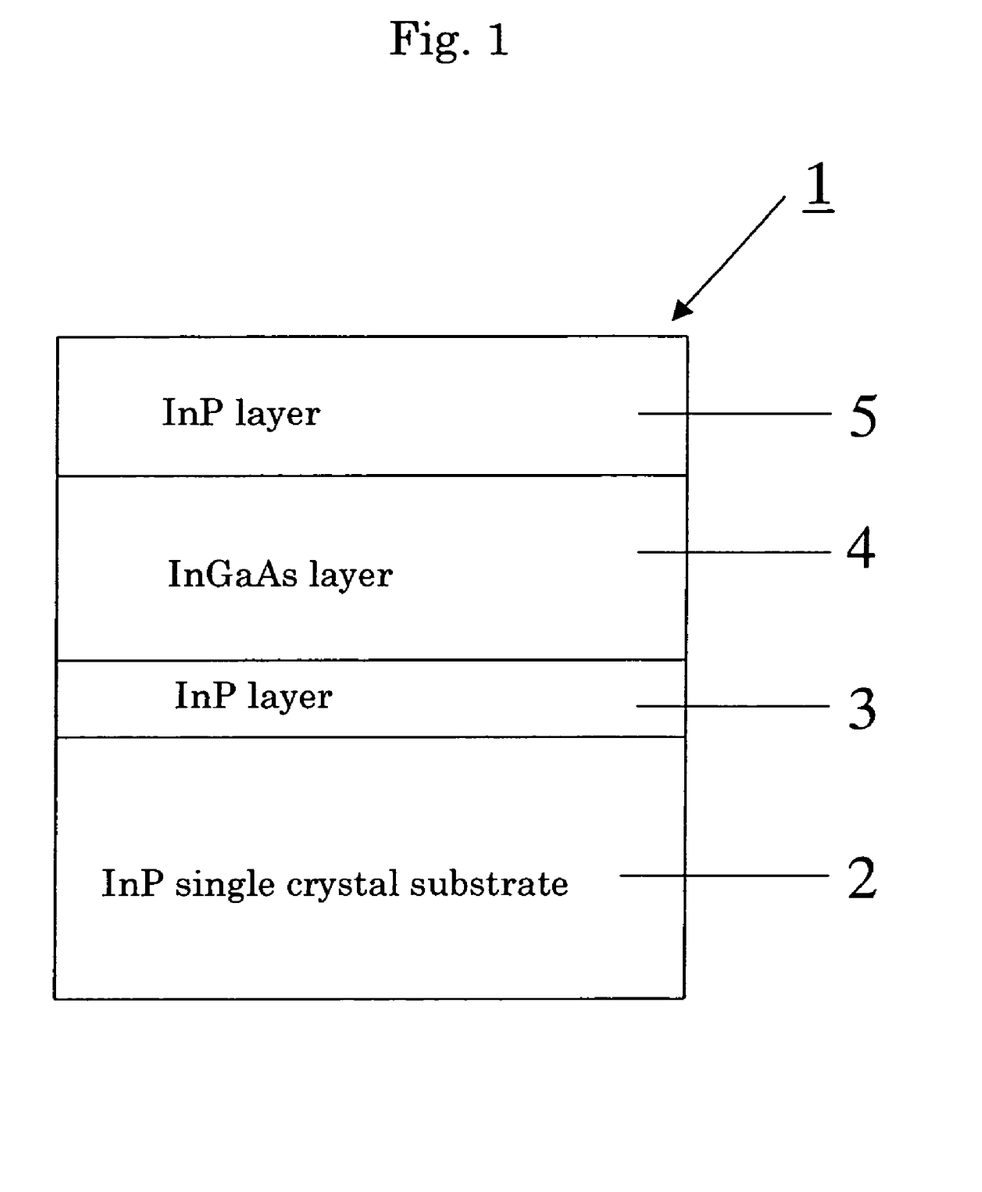
FIG. 1 shows a cross-sectional view of a compound semiconductor epitaxial substrate obtained by using the manufacturing method according to the present invention.

A method for manufacturing a compound semiconductor epitaxial substrate according to the present invention is illustrated with reference to FIG. 1. FIG. 1 is a cross-sectional view of a compound semiconductor epitaxial substrate (hereinafter abbreviated as "epitaxial substrate") 1 obtained by using the above manufacturing method. The epitaxial substrate 1 includes an InP substrate 2, an optional InP layer 3, an InGaAs layer 4, and an optional InP layer 5 in this order.

The InP substrate 2 is, for example, a single crystal substrate with an off-angle, which is a deviation from a plane direction (100), of about not more than 5°, preferably not more than 0.5°. The InP substrate 2 is preferably a substrate with an off-angle of about 0° (just substrate) in viewpoint of controlling the amount of impurities entrapped into the epitaxial layer and of applications in semiconductor lasers. Further, The InP substrate 2 has preferably the plane direction accuracy of ±0.05° in the (100).

A layer (for example, the InP layer 3 shown in FIG. 1) being lattice-matched to the InP substrate 2 is preferably grown on the InP substrate 2. Examples of the epitaxial layer being lattice-matched to the InP substrate 2 include an InP layer, InGaAs layer, InAlAs layer, InGaAsP layer, and GaAsSb layer. The layer being lattice-matched to the InP substrate 2 may be grown by vapor growth such as MOCVD and molecular beam epitaxy (hereinafter referred to as MBE). The vapor growth of the InP substrate 2 may be carried out under conventional conditions.

The InGaAs layer 4 is grown on the InP substrate 2, or on an optional epitaxial layer grown on InP substrate 2 which is lattice-matched to the InP substrate 2. The InGaAs layer 4 may be grown by vapor growth such as MOCVD and MBE, preferably grown by MOCVD.

The ratio of V/III in the vapor growth of the InGaAs layer 4 is not less than 10, preferably not less than 50 and is not more than 100, preferably not more than 70. When the ratio of V/III is within the above range, an epitaxial substrate with few concave defects is obtained. When the ratio of V/III is lower than 10, group V vacancy defects generate in the epitaxial layer or anti-site defects (phenomena in which the group III elements occupy group V sites) generate. It is assumed that the group V vacancy defect is related to shortage of the group V elements. The ratio of V/III means a proportion of feed rate of group V raw material to feed rate of group III raw material for the manufacture of the III-V group epitaxial substrate. For example, in vapor growth, an organic metal used as a raw material is fed in gaseous form from a gas cylinder or a bubbler.

When the gas cylinder is used, a feed rate of a raw material gas may be controlled by using a flow controller such as a MASSFLOW placed on a feed line. The feed rate of raw material gas is represented as "concentration of raw material gas in the gas cylinder"×"flow rate of raw material gas".

When the bubbler is used, the feed rate of the raw material gas may be controlled by using a flow controller such as a MASSFLOW placed on a feed which supplies a carrier gas to the bubbler. The feed rate of raw material gas is represented as "flow rate of carrier gas"×"vapor pressure of raw material in bubbler"/"gas pressure in the bubbler".

Examples of the group V raw material include arsine (AsH₃). Examples of the group III raw material include indium compounds such as trimethyl indium (TMIn), gallium compounds such as trimethyl gallium (TMGa) and triethyl gallium (TEGa). The gallium compound is preferably TMGa. By using TMGa, an epitaxial substrate including an epitaxial layer with uniform distribution of indium (In) is obtained. A vapor growth temperature of the InGaAs layer 4 is not less than 630° C., preferably not less than 640° C., more preferably not less than 650° C. and not more than 700° C., preferably not more than 680° C., more preferably not more than 670° C. When the vapor growth temperature is within the above range, an epitaxial substrate with few concave defects is obtained.

A vapor growth rate of the InGaAs layer 4 is not less than 0.6 μm/h, preferably not less than 0.8 μm/h and not more than 2 μm/h, preferably not more than 1.2 μm/h. The vapor growth rate may be controlled by adjusting the feed rate of raw material gas.

In the method for manufacturing a compound semiconductor epitaxial substrate according to the present invention, further, a layer may be further grown on the InGaAs layer 4.

For example, a InP layer 5 may be grown thereon. The InP layer 5 may be grown by vapor growth such as MOCVD and MBE.

Method of Reducing Concave Defects in Compound Semiconductor Epitaxial Substrate In the method of reducing concave defects in a compound semiconductor epitaxial substrate according to the present invention, the concave defects is reduced by growing an InGaAs layer on a single crystal InP substrate by vapor growth such as MOCVD and MBE under the same conditions as described above (ratio of V/III, temperature, growth rate, In raw material, Ga raw material and As raw material). The single crystal InP substrate may have an off-angle of about not more than 5°, preferably not more than 0.5°.

Compound Semiconductor Epitaxial Substrate

A compound semiconductor epitaxial substrate according to the present invention includes, for example, an InP substrate 2, an optional InP layer 3, an InGaAs layer 4, and an optional InP layer 5 in this order as shown in FIG. 1.

The InP substrate 2 has a thickness of not less than about 250 μm and not more than about 700 μm. In the epitaxial substrate including the InP layer 3, the InP layer 3 has a thickness of not less than about 0 μm and not more than about 3 μm. The InGaAs layer 4 has a thickness of not less than about 0.1 μm and not more than about 6 μm and an In content of not less than about 0.51, preferably not less than about 0.52 and not more than about 0.53. Further, in the epitaxial substrate including the InP layer 5, the InP layer 5 has a thickness of not less than 0 μm and not more than 2 μm.

The compound semiconductor epitaxial substrate is obtained by using the above method for manufacturing a compound semiconductor epitaxial substrate.

EXAMPLES

The following examples will illustrate the present invention more in detail, but do not limit the scope of the invention.

Example 1

Figure 2:
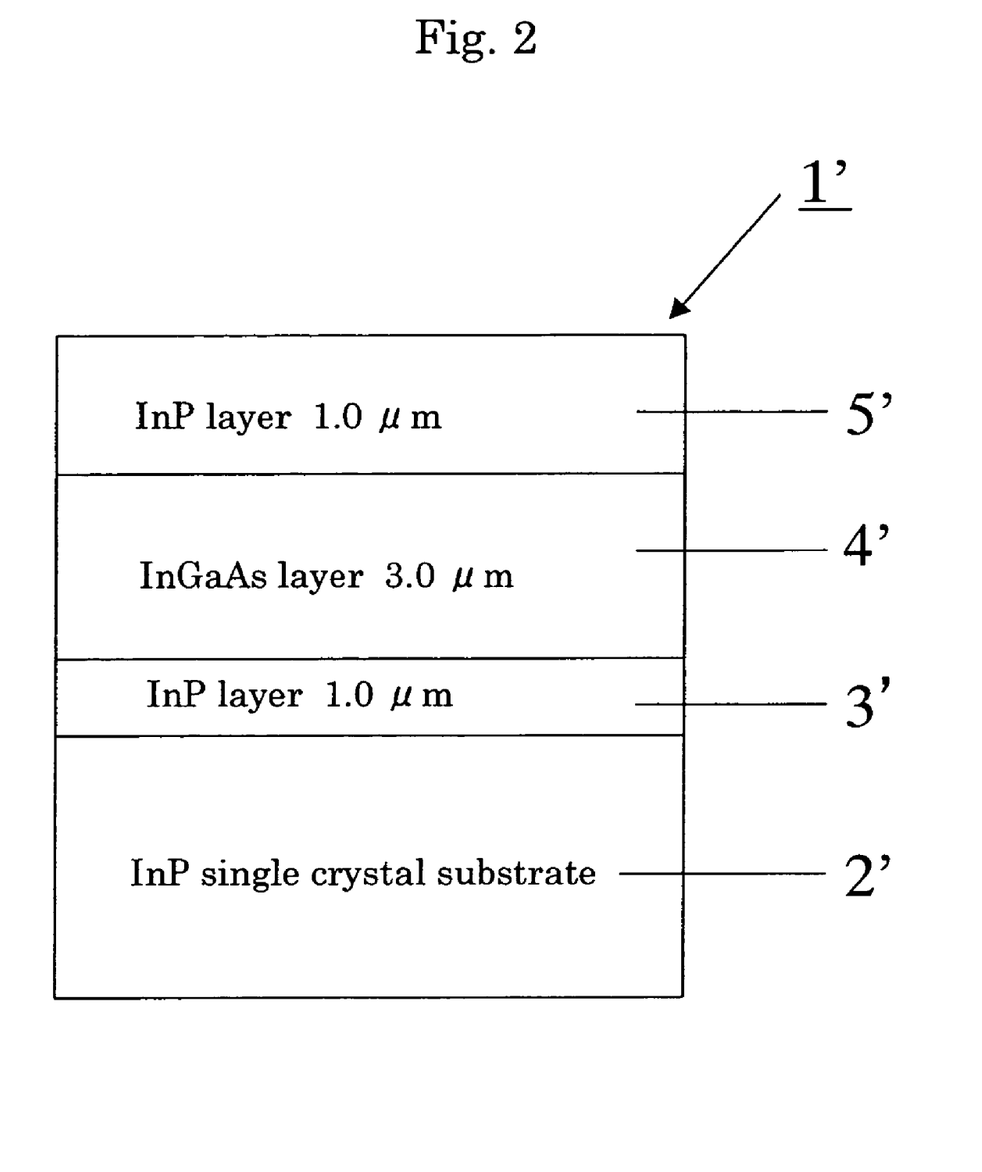
FIG. 2 shows a cross-sectional view of a compound semiconductor epitaxial substrate obtained in Example 1.

A compound semiconductor epitaxial substrate 1' which has a layer structure shown in FIG. 2 and is used for the manufacture of a p-i-n diode, was obtained by using the following method.

An InP substrate 2', which is a just substrate with a plane direction (100) and has a plane direction accuracy within ±0.05° and a diameter of about 8 cm, was placed in a MOCVD reactor for growing thin film.

The InP substrate 2' was surface-treated by elevating a temperature in the reactor to 660° C. and feeding a PH₃ gas. InP layer 3' having a thickness of 1 μm was grown on the InP substrate 2' using TMIn as a raw material. Then the PH₃ gas was changed for an AsH₃ gas, an InGaAs layer 4' having a thickness of 3 μm was grown under conditions of raw material: TMIn and TEGa,
ratio of V/III: 70,
growth temperature: 660° C., and
growth rate: 1 μm/h.

The AsH₃ gas was changed for the PH₃ gas, an InP layer 5' having a thickness of 1 μm was grown.

Figure 3:
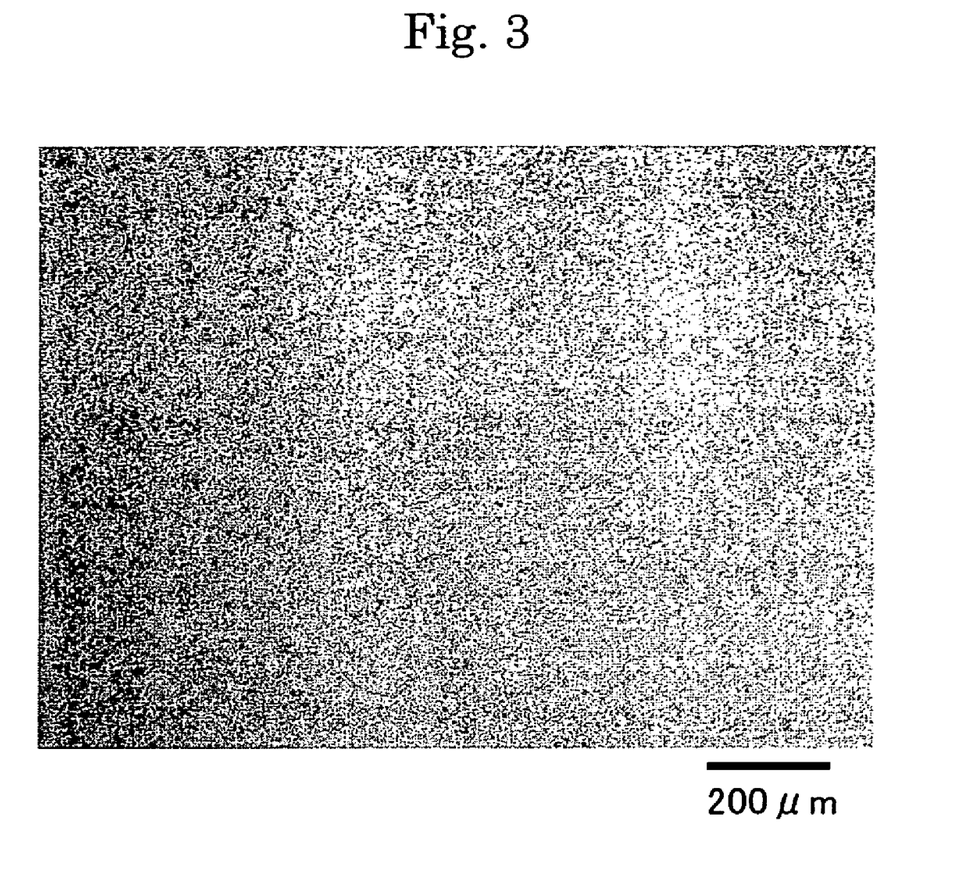
FIG. 3 is a photograph of a surface of the compound semiconductor epitaxial substrate obtained in Example 1.
Figure 4:
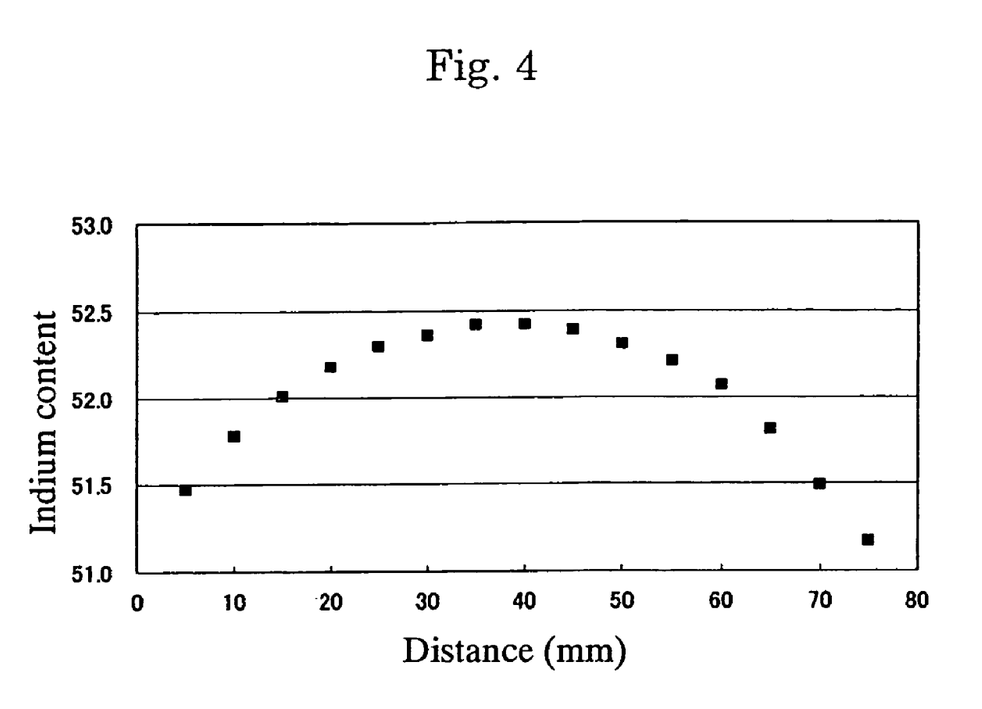
FIG. 4 shows an indium distribution within an InGaAs layer included in the compound semiconductor epitaxial substrate obtained in Example 1.

The epitaxial substrate had a good surface quality of the InP layer 5' and no concave defects on the surface. A photograph of the surface was shown in FIG. 3. The surface was observed by using a differential interference microscope. The In distribution in the InGaAs layer 4 of the epitaxial substrate obtained was shown in FIG. 4. In FIG. 4, a longitudinal axis indicated indium content(unit: %). The indium distribution was measured by using a high-resolution X-ray micro analyzer.

Example 2

An epitaxial substrate was obtained by the same operation as in Example 1 except that TEGa was changed for TMGa as the Ga raw material for growing the InGaAs layer 4.

Figure 5:
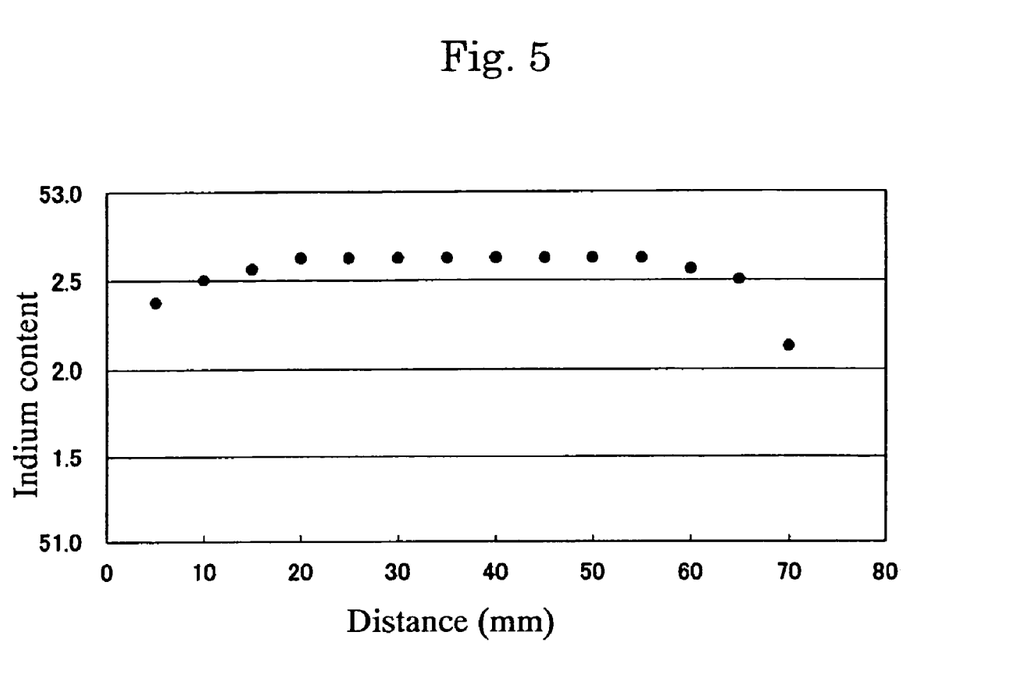
FIG. 5 shows an indium distribution within an InGaAs layer included in a compound semiconductor epitaxial substrate obtained in Example 2.

The epitaxial substrate had a good surface quality and no concave defects on the surface. The indium distribution in the InGaAs layer 4 was shown in FIG. 5.

Example 3

An epitaxial substrate was obtained by the same operation as in Example 2 except that the conditions for growing the InGaAs layer 4 was changed for the following.
ratio of V/III: 20,
growth temperature: 690° C., and
growth rate: 2 μm/h.

The epitaxial substrate had a good surface quality and no concave defects on the surface.

Comparative Example 1

An epitaxial substrate was obtained by the same operation as in Example 1 except that the conditions for growing the InGaAs layer 4 was changed for the following.
ratio of V/III: 70,
growth temperature: 620° C., and
growth rate: 1 μm/h.

The epitaxial substrate had no good surface quality and many concave defects on the surface.

Comparative Example 2

An epitaxial substrate was obtained by the same operation as in Example 1 except that the conditions for growing the InGaAs layer 4 was changed for the following.
ratio of V/III: 70,
growth temperature: 660° C., and
growth rate: 3 μm/h.

Figure 6:
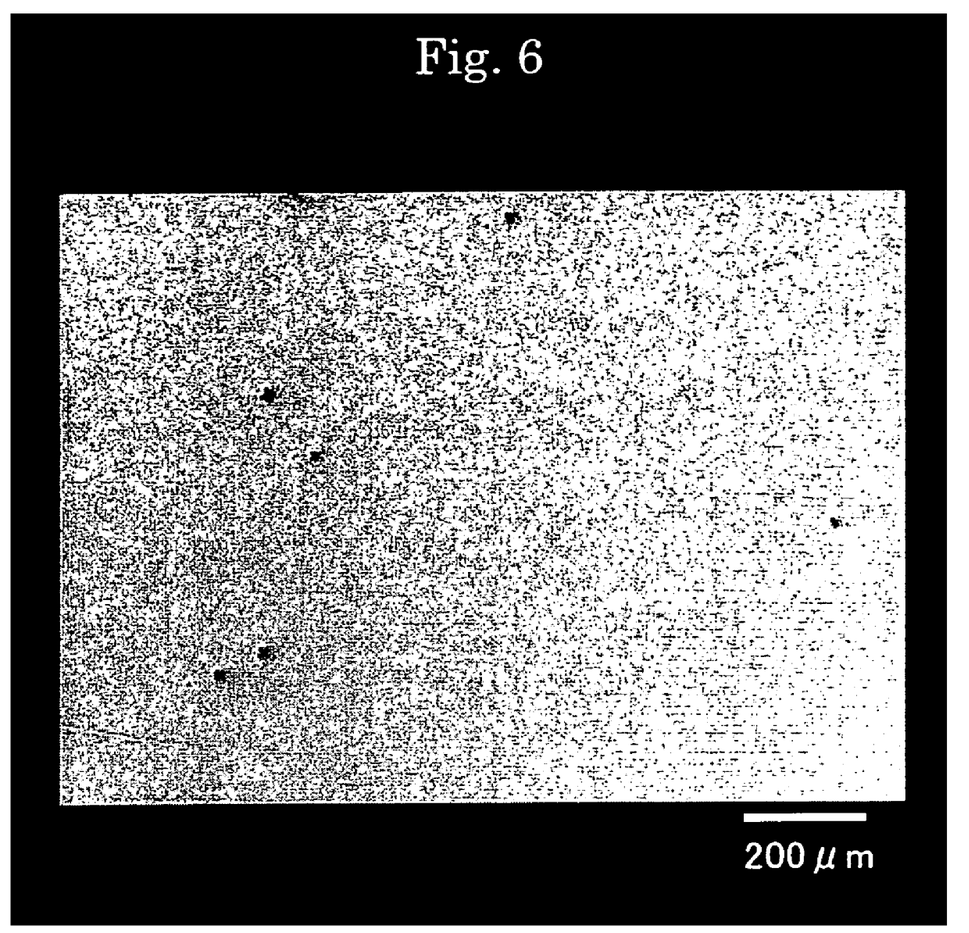
FIG. 6 is a photograph of a surface of a compound semiconductor epitaxial substrate obtained in Comparative example 2.

The epitaxial substrate had no good surface quality and many concave defects on the surface. A photograph of the surface was shown in FIG. 6.

Comparative Example 3

An epitaxial substrate was obtained by the same operation as in Example 2 except that the conditions for growing the InGaAs layer 4 was changed for the following.
ratio of V/III: 120,
growth temperature: 660° C., and
growth rate: 1 μm/h.

The epitaxial substrate had no good surface quality and many concave defects on the surface.

Test Example 1

An InP substrate 2', which is a just substrate with a plane direction (100) and has a plane direction accuracy within ±0.05° and a diameter of about 8 cm, was placed in a MOCVD reactor for growing thin film.

The InP substrate 2' was surface-treated by elevating a temperature in the reactor to 660° C. and feeding a $PH_3$ gas.

InP layer 3' having a thickness of 1 μm was grown on the InP substrate 2' using TMIn as a raw material. Then the $PH_3$ gas was changed for an $AsH_3$ gas, an InGaAs layer 4' having a thickness of 3 μm and indium content of 0.53 was grown under conditions of
raw material: TMIn and TEGa,
ratio of V/III: 63.4,
growth temperature: 660-700° C., and
growth rate: 1 μm/h.

The $AsH_3$ gas was changed for the $PH_3$ gas, an InP layer 5' having a thickness of 1 μm was grown. On growth temperature within the above range, the operations were repeated to obtain several epitaxial substrates.

Figure 7:
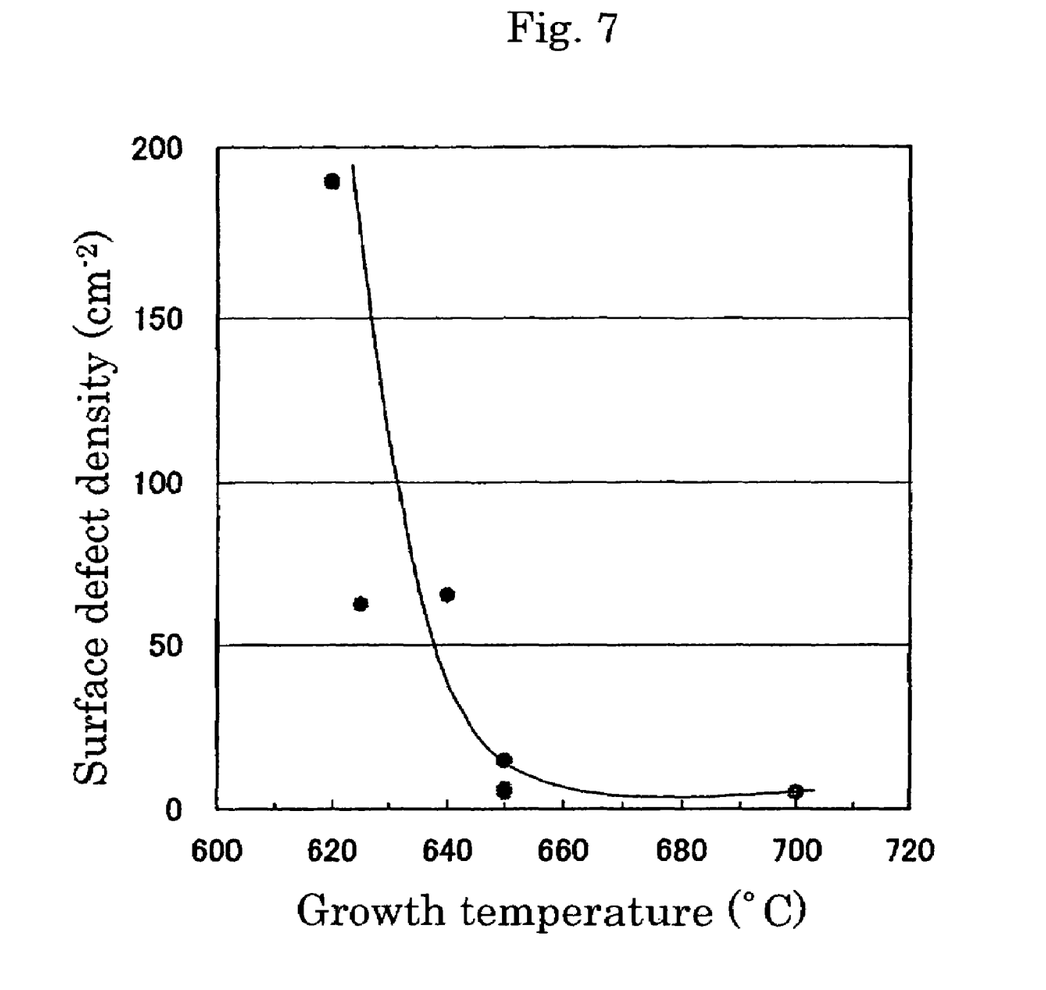
FIG. 7 shows a relationship between growth temperature of InGaAs layer and surface defect density of compound semiconductor epitaxial substrate obtained.

Concave defect densities on the surfaces (of the InP layers 5') of the epitaxial substrates were shown in FIG. 7. The concave defect densities were measured by using a surface defect analyzer(Surfscan 6220).

Test Example 2

An epitaxial substrate was obtained by the same operation as in Test example 1 except that the conditions for growing the InGaAs layer 4 was changed for the following.
ratio of V/III: 63.4,
growth temperature: 650° C., and
growth rate: 0.5-3 μm/h.

Figure 8:
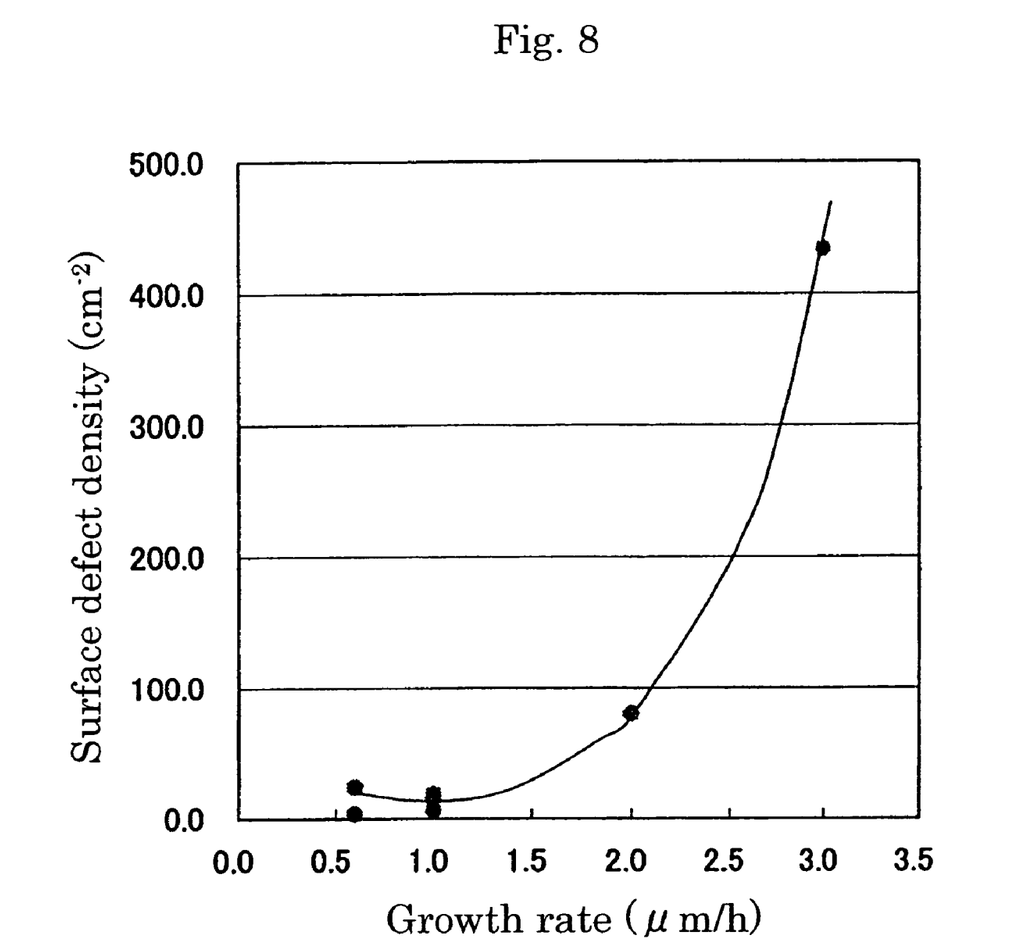
FIG. 8 shows a relationship between growth rate of InGaAs layer and surface defect density of compound semiconductor epitaxial substrate obtained.

On growth rate within the above range, the operations were repeated to obtain several epitaxial substrates. Concave defect densities on the surfaces of the epitaxial substrates were shown in FIG. 8.

Test Example 3

An epitaxial substrate was obtained by the same operation as in Test example 1 except that the conditions for growing the InGaAs layer 4 was changed for the following.
ratio of V/III: 30-112,
growth temperature: 650° C., and
growth rate: 1 μm/h.

Figure 9:
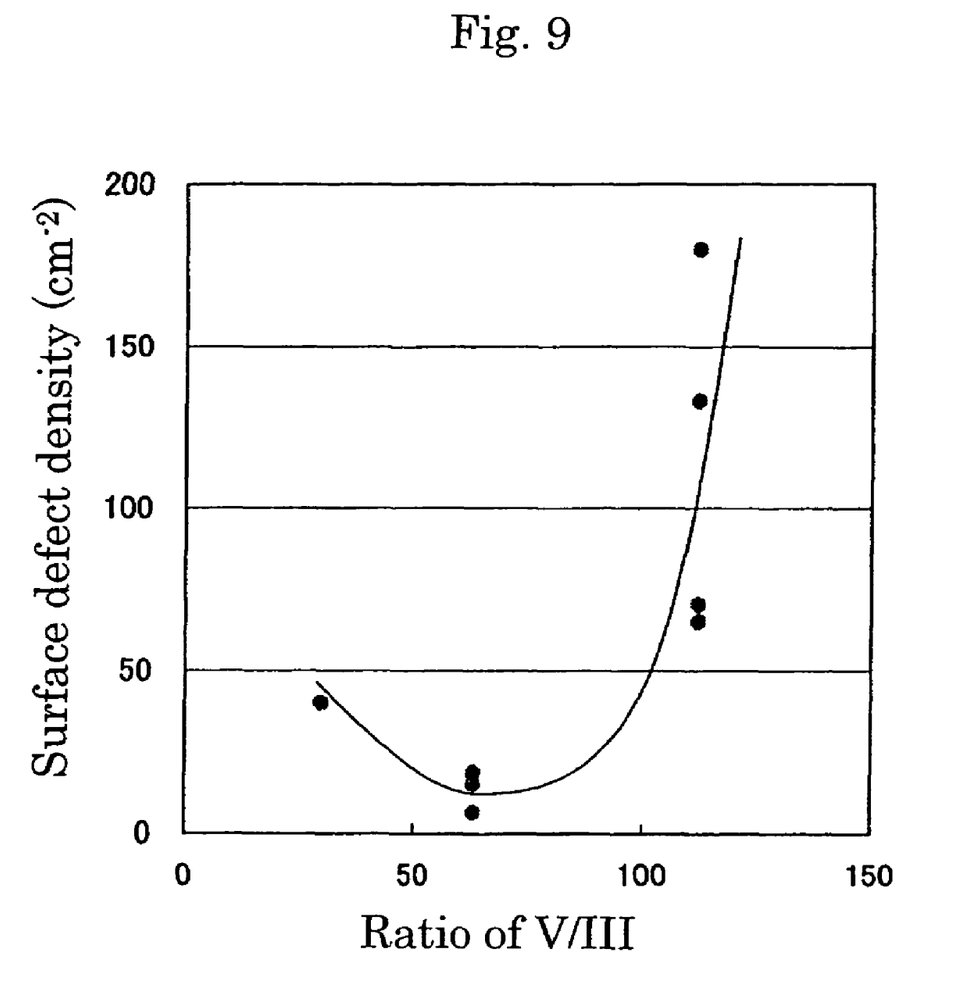
FIG. 9 shows a relationship between V/III ratio of grown InGaAs layer and surface defect density of compound semiconductor epitaxial substrate obtained.

On rate of V/III within the above range, the operations were repeated to obtain several epitaxial substrates. Concave defect densities on the surfaces of the epitaxial substrates were shown in FIG. 9.

The invention claimed is:

1. A method for manufacturing a compound semiconductor epitaxial substrate comprising a step of epitaxially growing an InGaAs layer on an InP single crystal substrate or on an epitaxial layer lattice-matched to the InP single crystal substrate under conditions of
ratio of V/III: 10-100,
growth temperature: 630° C.-700° C., and
growth rate: 0.6 μm/h-2 μm/h,
wherein the InP single crystal substrate has a plane direction accuracy of ±0.05° in the (100).

2. The method according to claim 1, wherein the epitaxially growing is carried out by using metal-organic chemical vapor deposition (MOCVD).

3. The method according to claim 1, wherein the epitaxially growing of the InGaAs layer includes use of gallium raw material selected from the group consisting of trimethyl gallium and triethyl gallium.

4. The method according to claim 1, wherein the epitaxial growing of the InGaAs layer includes use of indium raw material comprising trimethyl indium.

5. The method according to claim 1, wherein the epitaxial growing of the InGaAs layer includes use of arsenic raw material comprising arsine.

6. A method for reducing concave defects in a compound semiconductor epitaxial substrate comprising a step of epitaxially growing an InGaAs layer on an InP single crystal substrate or on an epitaxial layer lattice matched to the InP single-crystal substrate under conditions of ratio of V/III: 10 to 100, growth temperature: 630° C.-700° C., and growth rate: 0.6 μm/h-2 μm/h, wherein the InP single crystal substrate has a plane direction accuracy of ±0.05° in the (100).

* * * * *